(12) United States Patent
Kang et al.

(10) Patent No.: US 11,010,304 B2
(45) Date of Patent: May 18, 2021

(54) MEMORY WITH REDUCED EXPOSURE TO MANUFACTURING RELATED DATA CORRUPTION ERRORS

(71) Applicant: Intel Corporation, Santa Clara, CA (US)

(72) Inventors: Uksong Kang, Hillsboro, OR (US); Kjersten E. Criss, Beaverton, OR (US); Rajat Agarwal, Beaverton, OR (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 127 days.

(21) Appl. No.: 15/865,642

(22) Filed: Jan. 9, 2018

(65) Prior Publication Data

US 2019/0042449 A1    Feb. 7, 2019

(51) Int. Cl.
*G11C 29/00*    (2006.01)
*H04L 1/00*    (2006.01)
(Continued)

(52) U.S. Cl.
CPC ........ *G06F 12/0879* (2013.01); *G06F 3/0614* (2013.01); *G06F 11/1064* (2013.01); *G06F 12/0246* (2013.01); *G06F 12/0851* (2013.01); *G06F 12/0893* (2013.01); *G11C 7/10* (2013.01); *G11C 11/1655* (2013.01); *G11C 11/1657* (2013.01); *G11C 11/408* (2013.01); *G11C 11/4085* (2013.01); *G11C 11/4091* (2013.01); *G11C 11/4094* (2013.01); *G06F 11/10* (2013.01); *G06F 12/0607* (2013.01); *G06F 2212/1032* (2013.01); *G11C 11/409* (2013.01); *G11C 29/42* (2013.01)

(58) Field of Classification Search
CPC ............. G06F 12/0879; G06F 12/0246; G06F 3/0614; G06F 11/10; G06F 12/0851; G06F 12/0893; G06F 12/0607; G06F 11/1064; G06F 2212/1032; G11C 11/655; G11C 11/1657; G11C 11/409; G11C 11/1655; G11C 11/408; G11C 11/4085; G11C 11/4091; G11C 11/4094; G11C 7/10; G11C 29/42
USPC ........ 711/111, 114, 120, 148, 150, 152, 168, 711/173; 714/763, 766, 762, 767, 820, 714/821; 365/763, 766, 762, 767, 820, 365/821
See application file for complete search history.

(56) References Cited

U.S. PATENT DOCUMENTS 4,775,978 A * 10/1988 Hartness ............. G06F 11/1008
714/770
2003/0043669 A1 * 3/2003 Keeth ................... G11C 7/1006
365/220

(Continued)

*Primary Examiner* — Christine T. Tu
(74) *Attorney, Agent, or Firm* — Compass IP Law PC

(57) ABSTRACT

A method performed by a memory is described. The method includes sensing first bits from a first activated column associated with a first sub-word line structure simultaneously with the sensing of second bits from a second activated column associated with a second sub-word line structure. The method also includes providing the first bits at a same first bit location within different read words of a burst read sequence and providing the second bits at a same second bit location within the different read words of the burst read sequence.

17 Claims, 9 Drawing Sheets

(51) Int. Cl.
  *G06F 12/0879* (2016.01)
  *G06F 3/06* (2006.01)
  *G06F 12/02* (2006.01)
  *G11C 11/16* (2006.01)
  *G11C 11/408* (2006.01)
  *G06F 11/10* (2006.01)
  *G06F 12/0846* (2016.01)
  *G11C 7/10* (2006.01)
  *G06F 12/0893* (2016.01)
  *G11C 11/4094* (2006.01)
  *G11C 11/4091* (2006.01)
  *G11C 11/409* (2006.01)
  *G11C 29/42* (2006.01)
  *G06F 12/06* (2006.01)

(56) References Cited

U.S. PATENT DOCUMENTS

| | | | |
|---|---|---|---|
| 2004/0246783 A1* | 12/2004 | Lee | G11C 7/1027 |
| | | | 365/189.05 |
| 2011/0103164 A1* | 5/2011 | Yun | G11C 29/40 |
| | | | 365/201 |
| 2011/0205824 A1* | 8/2011 | Kajigaya | G11C 7/1006 |
| | | | 365/219 |

* cited by examiner

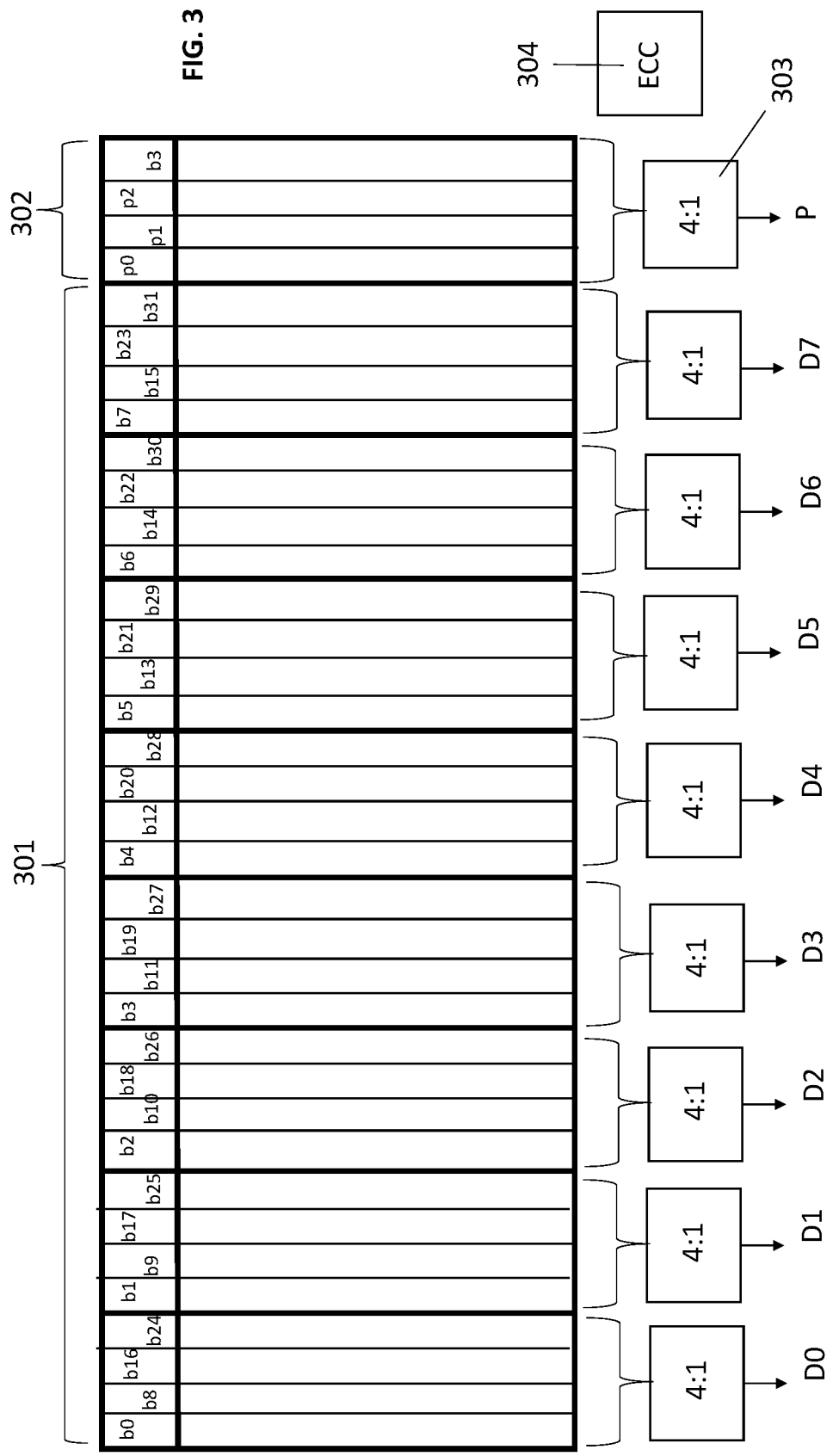

MEMORY WITH REDUCED EXPOSURE TO MANUFACTURING RELATED DATA CORRUPTION ERRORS

FIELD OF USE

The field of use generally pertains to computing systems, and, more specifically, to a memory with reduced exposure to manufacturing related data corruption errors.

BACKGROUND

A computing system's performance is largely dependent on the performance of its system memory (also referred as main memory). As such, memory designers are constantly seeking ways to change or otherwise improve how memory is designed, manufactured and/or implemented into a computing system.

FIGURES

Figure 1A:
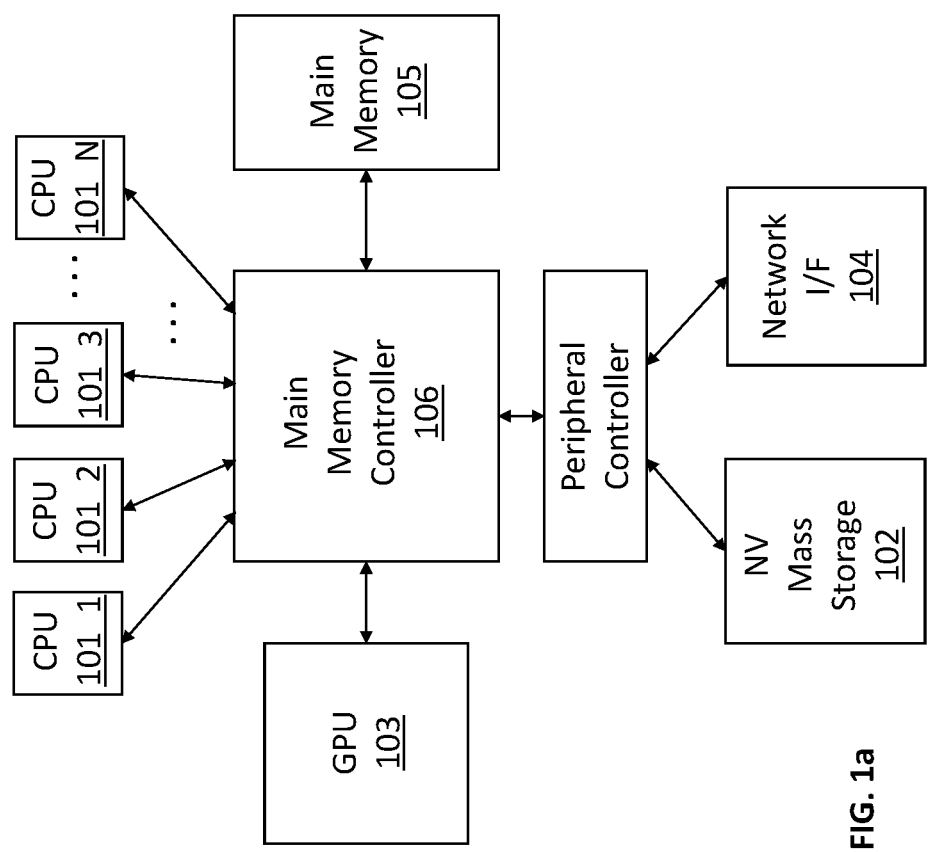
Figure 1B:
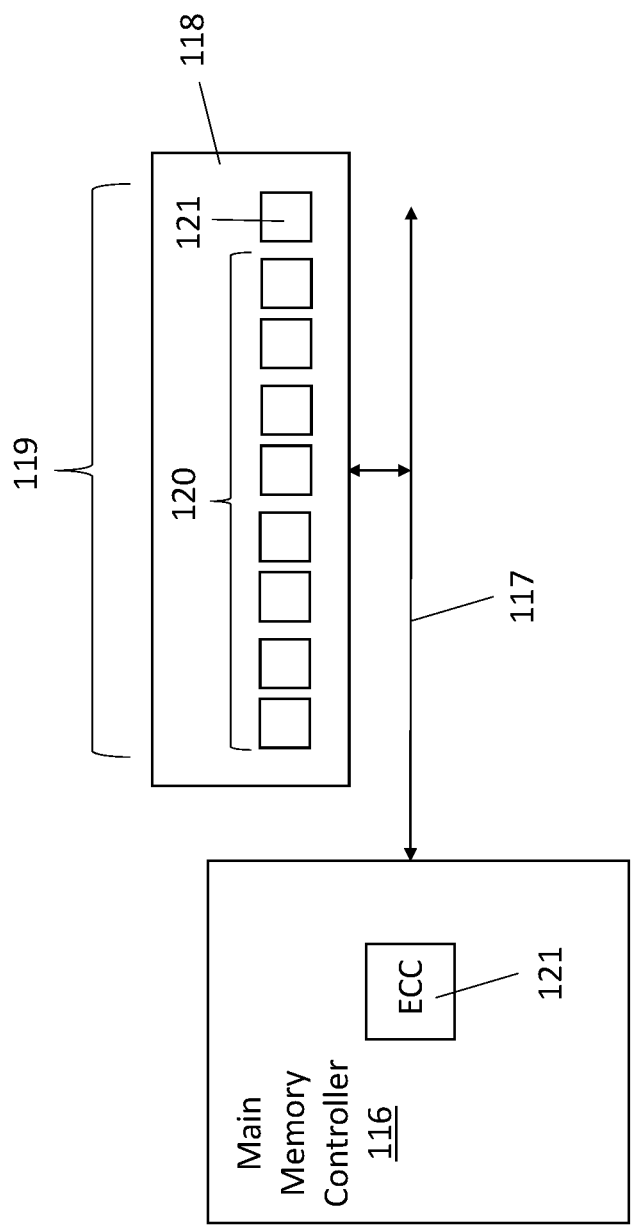
Figure 1C:
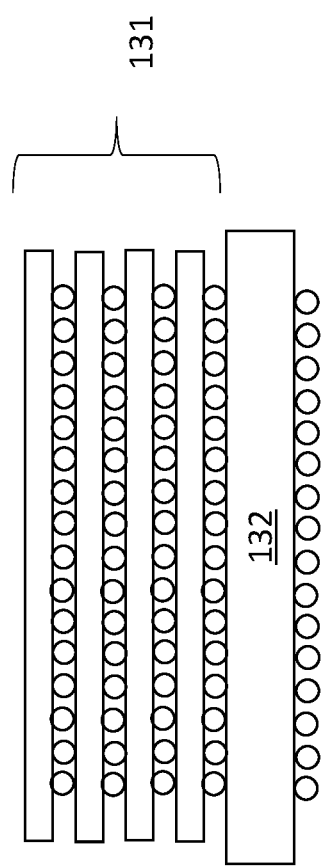
Figure 2A:
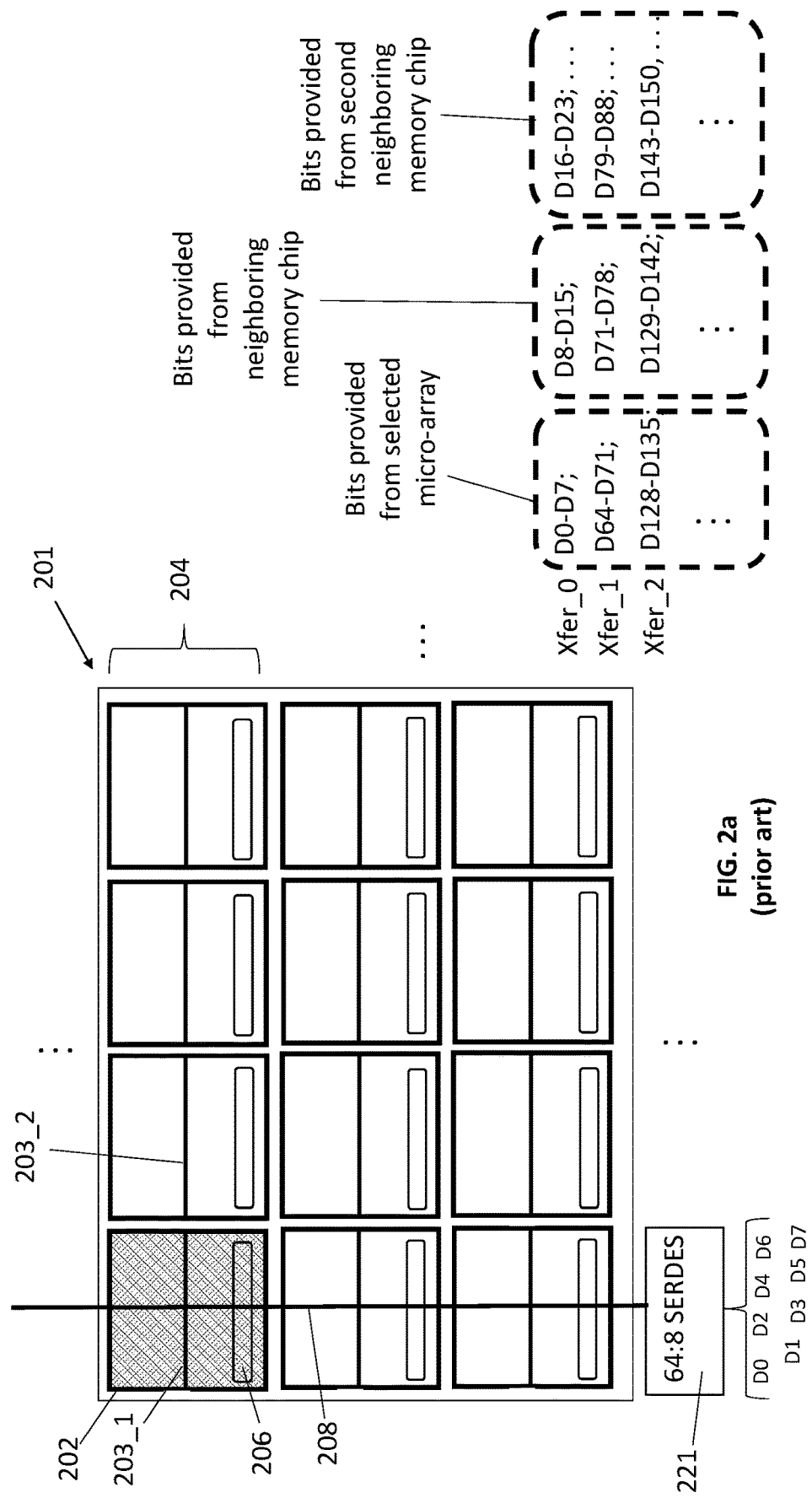
Figure 2B:
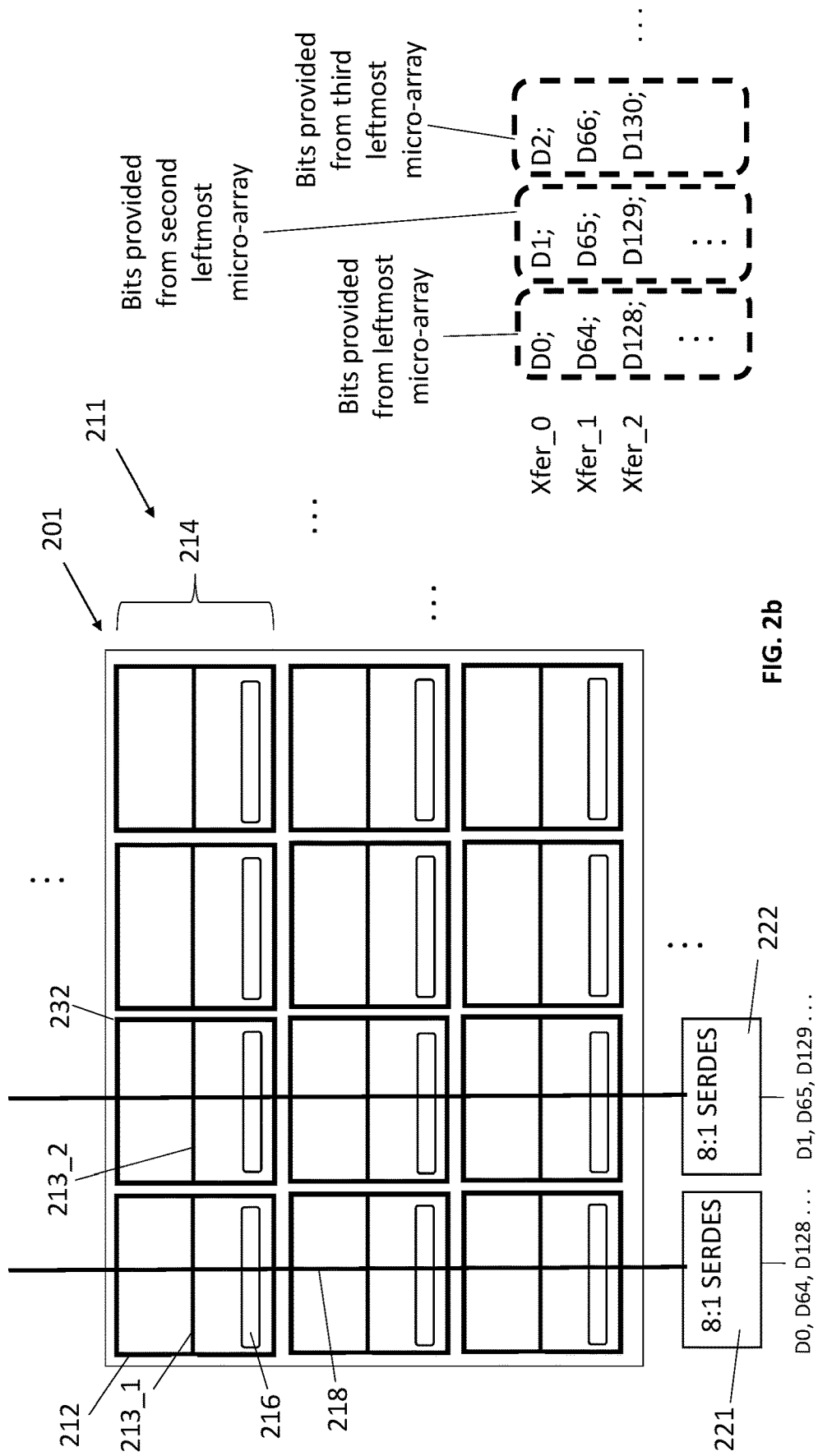
Figure 2C:
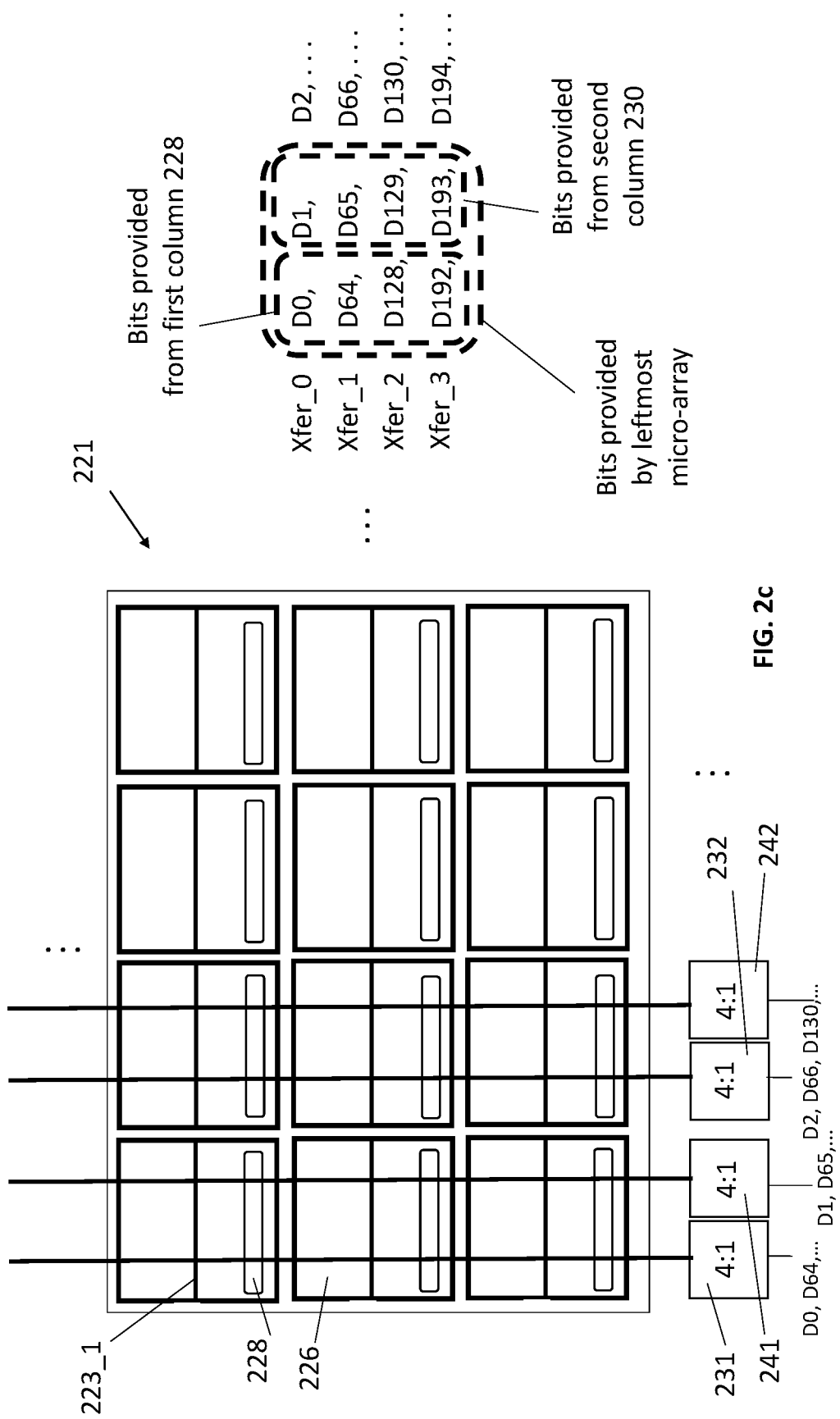
Figure 4:
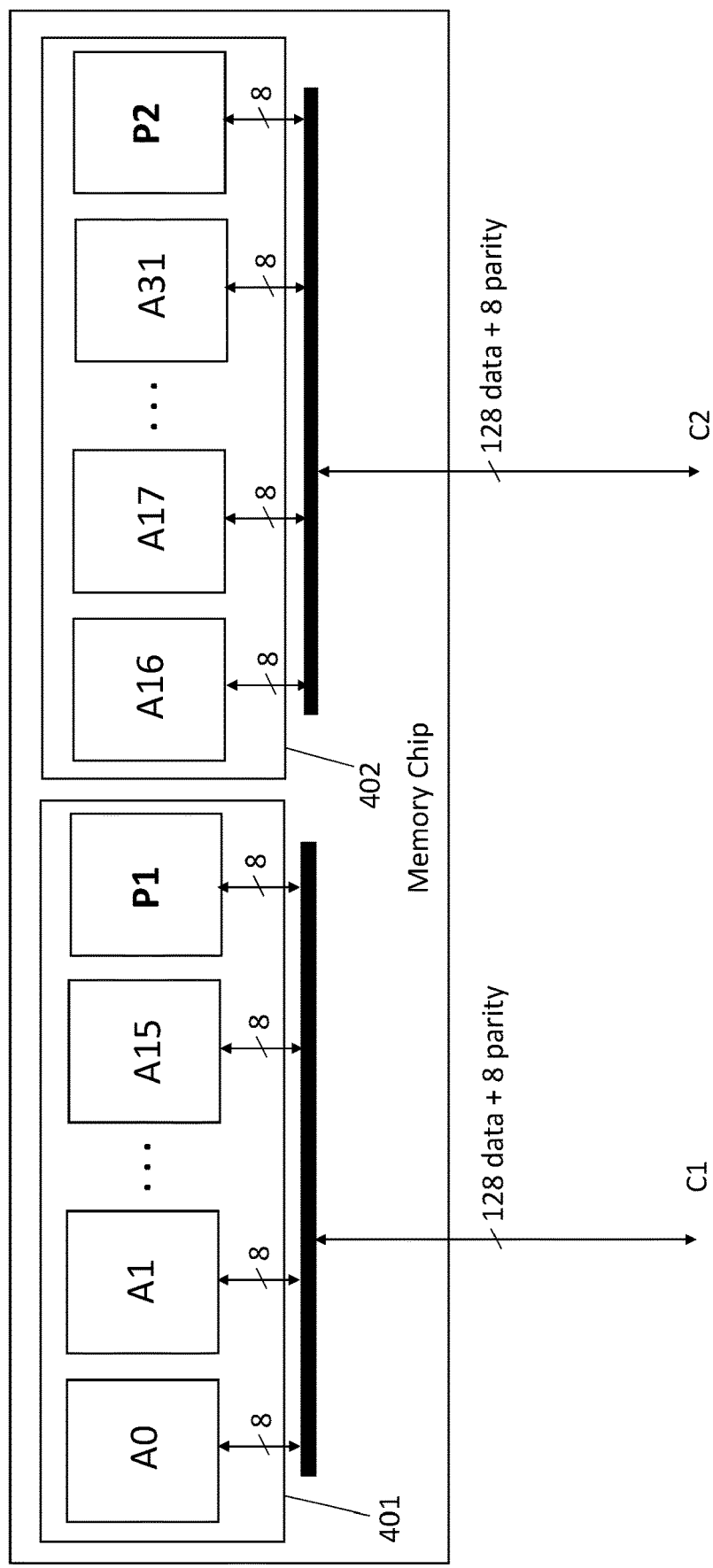
Figure 5:
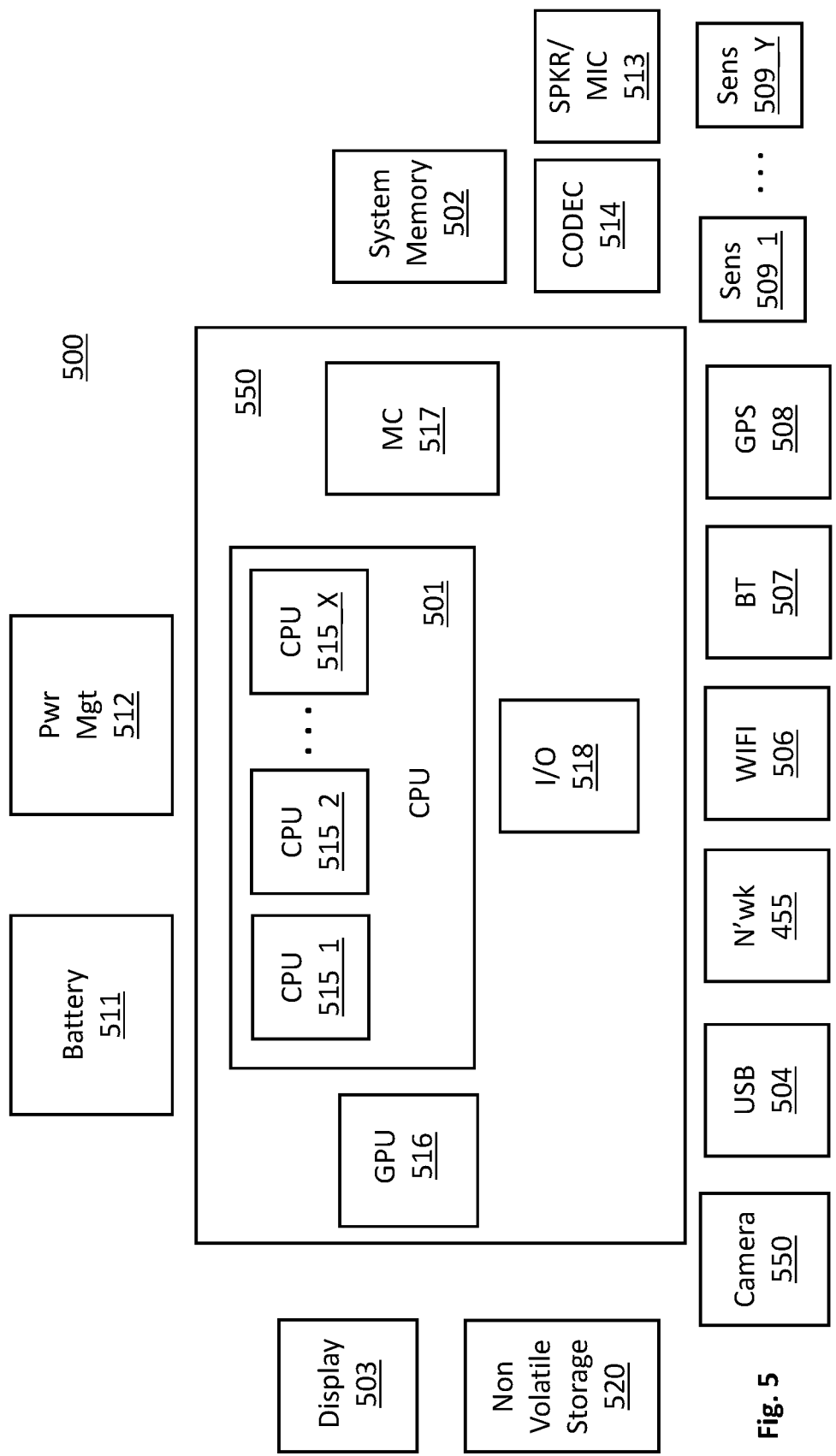

A better understanding of the present invention can be obtained from the following detailed description in conjunction with the following drawings, in which:

FIG. 1a shows a computing system
FIG. 1b shows a DIMM;
FIG. 1c shows a stacked memory solution;
FIG. 2a shows a traditional memory architecture;
FIG. 2b shows a first improved memory architecture;
FIG. 2c shows a second improved memory architecture;
FIG. 3 shows macro-array having ECC information;
FIG. 4 shows memory channels, memory banks and parity of a stacked memory solution;
FIG. 5 shows a computing system.

DETAILED DESCRIPTION

FIG. 1a shows a traditional computing system 100 that includes multiple central processing unit (CPU) cores 101_1 through 101_N, mass storage 102, a graphics processor 103 and a networking interface 104 all coupled to a main memory 105 through a main memory controller 106. Here, each of the CPU cores 101_1 through 101_N, non volatile mass storage 102, graphics processor 103 and networking interface 104 may read/write information from/to the main memory 105 by issuing corresponding read/write requests to the memory controller 106. The memory controller 106 responds to these requests by writing information into the main memory 105 (in the case of a write request) or reading information from the main memory 105 (in the case of a read request).

The main memory 105 itself is traditionally composed of dynamic random access memory (DRAM). In the case of, e.g., a larger computing system such as desktop computer or server computer, the DRAM is typically implemented with multiple Dual In-Line Memory Modules (DIMMs) that plug into respective one or more memory channels that stem from the memory controller 106. Each DIMM also includes multiple memory chips in order to noticeably expand the capacity of system memory with each DIMM that is plugged into the system. Additionally, having multiple chips per DIMM allows for some protection against data errors in conjunction with ECC information that is calculated by the memory controller 106 specifically for a specific unit of data (e.g., cache line) and written into the DIMM.

FIG. 1b shows a high level view of a traditional memory controller 116, a memory channel 117 that stems from the memory controller 116 and a DIMM 118 that is plugged into the memory channel 117 (often, there are multiple DIMMs per memory channel and multiple memory channels that stem from the memory controller). Here, the DIMM 118 includes nine memory chips 119 that each store data in eight bit words (i.e., the data bus width of each memory chip is one byte). Of the nine "X8" memory chips 119, eight 120 are used to store data and the ninth 121 is used to store ECC information. As such, the DIMM (and underlying memory channel) has a 64 bit data bus with 8 bits of ECC.

The memory controller 116 writes data to/from the DIMM 118 over the memory channel 117 as "cache lines" of information that are themselves composed of 64 bytes (64B) of information. Here, each cache line is written/read to/from the DIMM 118 as a "burst" of eight 72 bit words (64 bits of data plus 8 bits ECC) that are transported over eight consecutive write/read cycles of the memory channel (e.g., four clock pulses of a double data rate (DDR) memory channel). Over the course of the burst, eight different addresses are internally applied to the memory chips 119 sequence (e.g., a first access applies a "base" address and subsequent accesses of the burst apply an address that is an increment above its immediately preceding address).

Prior to writing the cache line into the DIMM 119, ECC logic circuitry 121 of the memory controller 116 calculates a 64 bit ECC value from the 64 bytes of cache line data. The ECC value is therefore specific to the cache line's particular data patterns. If there is any corruption to the 64 bytes of data during a subsequent read of the cache line from the DIMM 118, the ECC information (which is read along with the cache line data from the DIMM 118) can be processed by the ECC logic circuitry 121 along with the cache line read data to recover/correct the corrupted information.

Part of the robustness of the ECC data recovery mechanism is that the storage of the cache line and ECC data are spread out over the multiple memory chips 119 on the DIMM 118. More specifically, the ability to recover lost data becomes more difficult as the number of incorrect bits increases. Here, generally, memory chips that impose corruptions are rare. Spreading the storage of the cache line and ECC information over the multiple memory chips 119 reduces the impact if one of the memory chips happens to be error prone.

FIG. 1c shows an emerging memory packaging technology in which vertically stacked memory chips 131 are mounted on top of a controller semiconductor chip 132. Unfortunately, unlike the traditional DIMM solution discussed above with respect to FIG. 1b in which cache line data is spread out over multiple memory chips, in the case of the stacked solution of FIG. 1c, in various implementations, an entire cache line may be stored in a same memory chip. Here, there exists a dedicated point-to-point between the controller chip 132 and each individual memory chip (e.g., one link per memory chip). The controller chip 132 writes/reads data to/from any of the memory chips in the stack 131 along the targeted memory chip's dedicated point-to-point link. As such, spreading a same cache line across multiple die is not as straightforward as with a traditional DIMM and a single cache line may be stored in only one chip in the stack. Therefore, should a memory chip be error prone there is an increased risk that its stored cache line(s) will contain multiple errors making error recovery/correction with stored ECC code more difficult to accomplish.

A solution is an improved memory chip architecture having a design that purposefully "connects" a specific manufactured structure in the memory chip (e.g., a sub-wordline metal trace) that is more prone to failure to one or few data I/O lines of the memory chip. By so-doing, the memory chip is less likely to generate multiple errors in a single read data word. That is, should one of the manufactured structures actually induce corrupted read data, ideally, only one output bit of the read word is affected. Because only one output bit of the read word is affected, the error mechanism is "contained" and does not "spread" to other bits in the read word. In this case, recovery of the lost data with ECC protection should be more easily accomplished The specifically designed connection between a potential error inducing manufactured structure and a minimal number of I/O bits is unlike prior known memory architectures in which a single defect prone manufactured structure could easily affect multiple different I/Os of a memory chip.

FIGS. 2a and 2b compare a traditional DRAM architecture with a new DRAM architecture that reduces the number of I/O bits that could be affected from the failure of a particular manufactured structure that is prone to defects. FIG. 2a shows a traditional DRAM architecture while FIG. 2b shows an embodiment of the new architecture.

Referring initially to FIG. 2a, a portion of a macro-array 201 is depicted which includes a plurality of micro-arrays (for ease of drawing only one micro-array 202 of the macro-array 201 has been shaded and labeled with a reference number). Here, a four micro-array by four micro-array portion of the larger macro-array 201 is depicted (memory cells are commonly arranged in arrays). In actuality, the macro-array 201 may be composed of an 8×8 array of micro-arrays, a 16×16 array of micro-arrays, etc. The memory device may be composed of multiple macro-arrays so as to realize very high data storage capacity within the memory chip.

Rows of micro-arrays are coupled together by a same word-line. For ease of drawing the extended word lines for the three micro-array depicted rows are not shown in the figures. However, corresponding sub-word lines, which are described in more detail below, are depicted. Moreover, the sub-word lines for the first two micro-arrays of the top row of micro-arrays are labeled, 203_1, 203_2 in FIG. 2a and 213_1, 213_2 in FIG. 2b.

When a particular address resolves to macro-array 201, the address is further decoded to select one of the macro-array's word-lines, which, in turn, corresponds to the selection of a particular row 204 of micro-arrays across the macro-array 201.

The selection of the row 204 of micro-arrays "activates" the storage cells of these micro-arrays and causes their respected data to be loaded into sense amplifier banks that are associated with each micro-array. For ease of drawing, only sense amplifier bank 206 of the leftmost micro-array 202 of the selected row 204 is labeled. Here, each micro-array can be viewed as including numerous columns each having, e.g., 8 stored bits. The activation of the selected word line causes the respective 8 bits of each column along the selected row 204 of micro-arrays to be loaded into the sense amplifier banks. For example, if there are 8 bits per column and 128 columns per micro-array, 1024 bits are loaded into each sense amp of each micro-array along the row 204 during activation.

Finally, further decoding of the address causes one column within each micro-array (amongst the multiple columns per micro-array) to be selected. The bits from the selected column and a number of neighboring columns are then placed on an I/O bus for presentation at the memory device's output interface. The selected and neighboring columns should amount to a total number of columns that is equal to the number of transfers in the burst. For ease of drawing, only the I/O bus 208 for the leftmost micro-arrays is drawn in FIG. 2a. Thus, for a burst length of eight transfers, the eight bits from the selected column of micro-array 202 and the eight bits from each of the next seven columns (a total of 64 bits) are presented on I/O bus 208 from sense amp 206. Here, 64 bits are said to be "prefetched" from the micro-array 202 and presented on the I/O bus 208. The 64 prefetched bits are entered into a 64:8 serializer 221.

In the example of FIG. 2a, during presentation of the first 64 bit data word of the eight word burst, bits D0-D7 are presented from the serializer 221. These eight bits correspond to the bits from the first selected column of micro-array 202. For the next transfer (the second 64 bit data word of the burst) the eight bits from the second of the selected columns of micro-array and that were entered into the serializer 221 during the prefetch. These bits correspond to bits D64-D71 of the overall read burst, which, in turn, correspond to the leftmost bits of the second data transfer (noting that bits D0-D7 corresponded to the leftmost bits of the first transfer). The process continues with the eight bits of each next column that was selected during the prefetch being emitted from the serializer 221 until, after eight 64 bit word transfers, all 64 prefetched bits have been emitted from the serializer 221 and the burst is complete (where, serializer 221 provides the leftmost eight bits of each transfer word.

Notably, each micro-array has its own associated sub word-line. For ease of drawing, only the sub-word line 203_1 for the leftmost micro-array 202 and the sub-word line 203_2 for the second leftmost micro-array are labeled. Each sub-word line along a same row are electrically coupled to the physical word line which is not depicted in FIG. 2a for illustrative ease. A sub word line is a physical structure within the memory device. Sub word lines tend to have very fine pitch and contacts and therefore are amongst the most challenging structures to successfully manufacture. As a consequence, to the extent memory errors can be correlated to defects in specific manufactured memory structures, sub word line structures are amongst the most prevalent as sources of such errors.

A problem with the traditional memory design of FIG. 2a is that, as shown just above, multiple bits for a same read word are associated with a same sub word line. That is, the leftmost eight bits of each read transfer word in the read burst (64 bits total for the overall burst) are "sourced" from only one sub-word line only along row 204. Therefore, should the sub word line induce errors, potentially, eight bits in the same read data word will be affected (be corrupted). If so, for reasons explained above with respect to FIGS. 1a and 1b, the ECC coverage may not be able to correct these errors because there are too many bits in error per read word. As such the traditional design of FIG. 2a is insufficient at least for, e.g., stacked memory chip solutions in which an entire cache line is stored in a same memory chip.

Recognizing that the traditional approach of FIG. 2a sources multiple bits per read word from a same sub-word line, by contrast, an improved approach depicted in FIG. 2b sources only one bit per read word from a same sub-word line. In particular, whereas the traditional approach of FIG. 2a selects the output bits from one column (e.g., column 208) per read word in order to provide eight output bits per read word, by contrast, the improved approach of FIG. 2b simultaneously selects one bit from eight different columns per read word in order to provide eight output bits pre read word. Here, as observed in FIG. 2b, during prefetch, only column 218 is selected from micro-array 212 which provides only the leftmost bit (as opposed to leftmost eight bits) for all eight read transfers of the read burst, only column 219 is selected to provide only the second leftmost bit for all eight read transfers of the read burst (the remaining selected columns across the selected row are not depicted for illustrative ease).

Because only bit is provided per column per read word in the improved approach, in turn, one sub-word line sources only one bit per read word. That is, for instance, sub-word line 213_1 only sources the leftmost bit of each read word of the read burst. Therefore, should sub-word line 203_1 induce an error, only one bit will be affected in the read word which should make ECC recovery and correction more likely.

Here, full operation of the improved architecture includes resolution of an address to a particular word line and corresponding row of micro-arrays which, during activation, causes the data stored at each of the columns of these micro-arrays to be loaded into their corresponding sense amplifier banks. For simplicity, only the sense amplifier banks 216, 217 for the leftmost and second leftmost micro-arrays of the selected row of micro-arrays is depicted. Additional resolution of the address then selects multiple columns, where, one column per micro-array is selected (so that one column per sub-word line is selected).

The selection of the multiple columns then causes the data associated with each of these columns (e.g., 8 bits per column) to be issued from their respective sense amplifier banks 216, 217 during prefetch. In one embodiment, the issuance of this data corresponds to a prefetch of all the data needed for the entire read burst (the data for all eight transfer bursts are issued from the sense amplifier banks). Thus, whereas the traditional approach selects multiple columns per single micro-array during prefetch, by contrast, the particular approach of FIG. 2b selects only one column per micro-array during prefetch.

Each column of micro-arrays has an associated 8:1 serializer circuit 221, 222, etc. that receives the data that issued from its corresponding micro-array's sense amplifier bank (for ease of drawing FIG. 2b only shows the serializer circuit 221, 222 for the first two micro-array columns) during prefetch. Each of the serializer circuits 221, 222 subsequently issue only one of its prefetch bits for each read transfer word. For instance, serializer 221 receives the leftmost bit for all read transfer words. It therefore issues bit D0 for the first read transfer word, then issues bit D64 for the second read transfer word, then issues bit D128 for the third read transfer word, etc.

In an embodiment, the data that is stored along a same row corresponds to a "page" of information and all information of the page is loaded into the sense amplifier banks 216, 217, etc. along the row during activation. Then, as few as one column may be selected per micro-array (sense amplifier bank) to source the burst read. Here, note that the traditional approach may rely upon fewer micro-arrays to source a burst read (e.g., if all columns for the burst read of FIG. 2a are within micro-array 202, the entire burst read can be sourced from micro-array). By contrast, the approach of FIG. 2b may rely on a number of micro-arrays that is equal to the number of data bits being provided by the memory device. Thus, for a X8 memory device, eight micro-arrays may be used to source eight bits. If an entire cache line is stored in the memory device, which may correspond to the memory device being a X32 or X64 memory device (its memory bus is 32 bits wide or 64 bits wide), as many as 32 or 64 micro-arrays may be enabled on a single memory chip to source a burst read.

Note also that the burst length can be easily extended by changing the activated set of word lines during the burst read. That is, if the architecture of FIG. 2b is to support sixteen read transfers per burst sequence, the first eight transfers can be supplied with the set of activated set of columns depicted in FIG. 2a (column 218 for the leftmost micro-array, column 219 for the second leftmost micro-array). In order to support a following sequence of eight more read transfers, another column can be selected per micro-array (e.g., the column to the immediate right of column 218 within the leftmost micro-array, the column to the immediate right of column 219 within the second leftmost micro-array, etc.). Thus, the number of columns per micro-array that need to be selected during a read burst is a function of the number of stored bits that are associated with each column and the number of transfers per burst. If the number of transfers exceeds the number of bits associated with a column, more than one column can be activated per micro-array during the burst to fully supply the burst.

Although the particular embodiment of FIG. 2b sources only a single bit per read word from a same sub word line, other embodiments may feed more than one bit per read word (but fewer than, e.g., the eight associated with traditional approach of FIG. 2a). FIG. 2c shows such an embodiment where each sub-word line supports two bits per transfer word. Here, for simplicity, the embodiment of FIG. 2c assumes that each column is associated with four stored data bits and that burst length consists of four transfer words.

As such, any selected column can feed the entire burst length and the activation of two columns per micro-array during the burst read (specifically, columns 228 and 230 within the leftmost micro-array, columns 229 and 233 within the second leftmost micro-array, etc.) corresponds to each micro-array providing two bits per read transfer word. As such, there are two serializers per micro-array (serializers 231 and 241 for the leftmost micro-array, serializers 232, 242 for the leftmost micro-array, etc.). Here, the leftmost micro-array provides the two leftmost bits of each read transfer word during the burst, the second leftmost micro-array provides the second two leftmost, etc. Here, for example, the left half of the columns of a micro-array are coupled to the left serializer and the right half of the columns of the same micro-array are couple to the right serializer.

Note that if the burst length were extended to eight read transfers per burst, two more columns would need to be activated per micro-array where both of the serializers associated with a micro-array would each receive the data associated with one of the additional columns. For example, serializer 231 would receive the data from one of the extra columns and serializer 241 would receive the data from the other of the extra columns.

In providing two bits per read transfer word from a same micro-array, two bits per read transfer word are sourced from a same sub-word line. Although providing ECC coverage will be more challenging than the approach FIG. 2b, it will not be as challenging as with the traditional approach of FIG. 2a (which sources eight bits per read transfer from a same sub-word line).

Note that a wealth of other embodiments may exist besides the specific embodiments depicted in FIGS. 2b and 2c. Such alternate embodiments may have different number of bits that are sourced from a same sub word line and issued on a same read transfer word, different numbers of stored bits per column, different burst lengths, different read transfer word sizes, etc. than the specific exemplary embodiments discussed above with respect to FIGS. 2b and 2c. The discussions of FIGS. 2b and 2c explore some possible behavioral characteristics of the new approach that the wealth of other embodiments may also possess.

In order to increase the probability of being able to recover corrupted data from a sub word line failure, in various embodiments, parity data for a cache line that is stored in the memory device may also be stored in the same macro-array where the cache line itself is stored. Here, again, in various embodiments, the total amount of data that is associated with an entire read burst sequence corresponds to a complete cache line.

Note that data is serialized for reads but deserialized for writes. That is, the aforementioned examples discussed above with respect to FIGS. 2b and 2c were concerned with read bursts in which parallel bits of data were read per activated column and then serialized onto an output from a serializer size of a SERDES circuit to provide a single read bit at the memory output interface. By contrast, in the case of write operations, the reverse of the read operation transpires. That is, e.g., a single bit is received at the input of the SERDES circuit from the memory input interface for each of multiple words of a burst write sequence. After a number (e.g., all eight) of the words have been transferred, the SERDES circuit parallelizes the serial data that was received along the single bit channel of the memory input interface and the parallelized data is routed up the I/O column and stored in the storage cells of the micro-array that intersects the column and that has an activated word line.

FIG. 3 shows an embodiment of a macro-array for a more simplistic memory that supports a 32b cache line that is fully read with four burst transfers of 8 bits each. Only four stored bits are associated with each column such that only column per micro-array need be activated in order to fully supply the burst read. A 4:1 serializer is coupled to each micro-array. Access of any single row in the macro-array pre-fetches all 32 bits for a particular cache line. All four bits for each of the read transfers for each read word bit position are prefetched from the sense amplifiers and routed to the corresponding serializer. As such, there is one micro-array per read word data bit.

Thus, eight micro-arrays 301 are used to store cache line data D0 through D31 while a ninth micro-array 302 is used to store parity data P0 through P3. In the embodiment of FIG. 3, the parity data for a particular cache line is stored along the same row as the cache line's data and is prefetched in like manner as the cache line data (for simplicity, only the top row of the macro array shows a stored cache line and corresponding parity data). As such, all four parity bits across the four data transfers of the read burst are accessed during the same row access as the cache line data and forwarded to a corresponding the serializer 303 that feeds the parity bit on the data bus.

In the particular embodiment of FIG. 3, the size of the parity that is used to protect the cache line data is the same size as the amount of cache line data that could be corrupted by a sub word line failure. In the macro array of FIG. 4, a sub word line failure could potentially corrupt an entire micro-array, therefore, the parity field consumes an entire micro-array. This reduces, for the depicted top row of FIG. 3, to a top array row of parity being used to protect a top array row of cache line data. Each particular bit within the field is used to protect a same positioned bit of cache line data along the parity bit's own row. As such, for the cache line's worth of data depicted in FIG. 3, parity can be expressed as:

$p0=b0+b1+b2+b3+b4+b5+b6+b7$ $p1=b8+b9+b10+b11+b12+b13+b14$ $p2=b15+b16+b17+b18+b19+b20+b21$ $p3=B16+b17+b18+b19+b20+b21+b22$ where the "+" operator corresponds to an exclusive OR (XOR) function. This particular approach provides one bit of parity for one entire transfer word.

Here, the use of such "thin" parity coverage is acceptable at least in part because, as discussed above, the memory device's circuitry has been architected to generate errors, to the extent such errors are likely to happen, such that only one bit per read word is affected per failure event. In various embodiments, this "thin" parity function is implemented by the memory chip rather than the main memory controller.

That is, during a burst write sequence, ECC logic circuitry 304 that is embedded on the memory chip calculates parity bits on the incoming data words and stores these parity bits in the additional storage space 302 that is reserved in the memory array for the storing of parity. During a burst read, the parity information is processed along with the read data by the memory chip's ECC logic circuitry 304. If an error is detected, the ECC logic circuitry 304 corrects the error before transmitting the read word over the memory channel data bus to the memory controller. Here, the D0 through D7 I/Os that emanate from the serializers may be coupled directly to data I/Os on the memory channel bus (DQs). The internal parity information need not be transported over the memory channel (although it can be).

For larger read word structures, e.g., 64 bit read words, a single bit of parity may be insufficient to recover even a single error but may be sufficient to indicate the presence of an error. That is, the processing of the read word data and the parity bit may be enough to indicate the presence of an error but cannot specify which particular bit of the read word is in error. In this case, more parity may be provided (e.g., more than one bit per read transfer word) and/or the memory controller may add additional parity information (e.g., for the cache line as a whole consistent with traditional operation (e.g., as discussed with respect to FIG. 1b) that is sent to the memory device (or another memory device) and stored as separate data.

If the memory device detects an error from its internal "thin" parity protection it may raise an error flag and forward its internal parity information to the memory controller. The memory controller may then process the ECC information that the memory controller generated along with the parity information sent by the memory device to recover the error. Alternatively, the memory controller's ECC coverage may be sufficient to recover the error without the memory chip's parity information.

In still yet other embodiments, the memory controller may determine the parity information (e.g., the function of ECC logic 304 is within the memory controller and not the memory chip) that is geared to provide coverage to limited (e.g., single bit) errors generated from a particular type of memory failure. That is, in order to increase memory reliability, in various embodiments, corresponding controller ECC information is customized against data burst errors. Because data burst errors are also commonly caused by other failure modes (e.g. pin and column failures), these codes can correct against many types of failures, not just sub-word line failures. Since the errors are grouped together in a predetermined way, it is a relatively straight-forward task to construct symbol based error correction codes to protect against these failures. One scheme is to store a bit-wise parity that is the same size as the region effected by a sub-wordline failure as discussed above with respect to FIG. 3 which, e.g., can be determined internally to the memory chip or externally by the memory controller. This information can then be paired with an equal number of additional ECC bits calculated by the memory controller (and, e.g., stored in the memory device) that can be used to locate errors, creating a Reed-Solomon ECC scheme, or some other method to detect data that have failed (e.g. memory self-test) to enable erasure encoding type correction.

FIG. 4 shows a possible implementation of the above described principles in a stacked memory chip solution such as a stacked memory chip solution that complies with a High Bandwidth Memory (HBM) specification promulgated by JEDEC or other stacked memory chip specification (e.g., a Wide I/O specification promulgated by JEDEC). Here, two memory banks 401, 402 that are respectively coupled to a pair of channels C1, C2 are depicted. The first memory bank 401 includes sixteen 8×8 macro-arrays A0 through A15. The first memory bank 401 also includes an array to store ECC information P1. The memory bank 402 is similarly constructed but couples macro arrays A16 through A32 to the second channel C2.

The parity information may include: 1) "thin" coverage that is generated by internal ECC logic of the memory device and that is not normally presented on its respective memory channel; and/or, 2) ECC coverage that is generated by an external controller such as a main memory controller or the controller that the stacked memory chips are mounted on. FIG. 4 suggests the later approach with the coupling of the ECC arrays P1 and P2 to memory channels C1 and C2. The channels C1, C2 have 128 bit wide data buses. The implementation of a 128 bit data channel allows for two 64 bit data structures on any one channel. Therefore, a single 64B cache line can be passed over a channel with a burst length of four transfers.

According to various embodiments, each of the macro-arrays provides 8 bits of I/O per access. As such, each macro-array has, e.g., eight or four micro-arrays across its row-wise dimension where each micro-array has its own associated sub word line and only feeds, e.g., one or two of the eight I/Os of its associated maco-array. During an access along any particular row of a macro-array, multiple bits that are read from a same micro-array and are sourced from a same sub word line are read from their bit cell locations and routed to a serializer circuit that directly feeds an I/O that the micro-array sources. The multiple bits are then sent over the channel in series/succession over a number of transfers of the burst read.

It is pertinent to point out that the teachings provided herein are applicable not only to memory chips within a stacked memory chip solution but also to memory chips that are disposed on a DIMM.

Although embodiments described above have referred to DRAM memory chips, other types of memory chips may employ the design strategies described above. For example, to the extent it is reasonable to do so, emerging non volatile memory chips may include various ones of the design approaches described at length above. Examples of non volatile memory chips include three dimensional memories (e.g., where the memory cells are stacked in a chip's metallurgy above the semiconductor chip substrate) such as memories having storage cells composed of chalcogenide (e.g., phase change memory and switch (PCMS)). Other emerging non volatile memory chips include Resistive RAM (ReRAM) or other dielectric RAM, Ferroelectric RAM (FeRAM), magnetic spin-transfer random access memories, etc.

FIG. 5 provides an exemplary depiction of a computing system 500 (e.g., a smartphone, a tablet computer, a laptop computer, a desktop computer, a server computer, etc.). As observed in FIG. 5, the basic computing system 500 may include a central processing unit 501 (which may include, e.g., a plurality of general purpose processing cores 515_1 through 515_X) and a main memory controller 517 disposed on a multi-core processor or applications processor, system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_Y, one or more cameras 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing unit 516 typically executes graphics intensive functions to, e.g., generate graphics information that is presented on the display 503. The memory control function 517 interfaces with the system memory 502 to write/read data to/from system memory 502. The power management control unit 512 generally controls the power consumption of the system 500. The memory chips of the system memory 502, or other memory (such as memory that is local to the GPU), may be designed to limit the number of bits of a same read/write word that can be affected by a failure/defect of a particular, e.g., smallest, feature that has been manufactured within the memory chips such as explained at length above.

Each of the touchscreen display 503, the communication interfaces 504-507, the GPS interface 508, the sensors 509, the camera(s) 510, and the speaker/microphone codec 513, 514 all can be viewed as various forms of I/O (input and/or output) relative to the overall computing system including, where appropriate, an integrated peripheral device as well (e.g., the one or more cameras 510). Depending on implementation, various ones of these I/O components may be integrated on the applications processor/multi-core processor 550 or may be located off the die or outside the package of the applications processor/multi-core processor 550. The computing system also includes non-volatile storage 520 which may be the mass storage component of the system.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed:

1. An apparatus, comprising:
a memory chip comprising a) and b) below:
a) at least one macro-array comprising rows of word lines and a plurality of columns, the memory chip further comprising a first column associated with a first sub-word line structure and a second column associated with a second sub-word line structure, the memory chip further comprising a first N:1 serializer circuit between the first column and a first I/O of the memory chip and a second N:1 serializer circuit between the second column and a second I/O of the memory chip, wherein N is an integer, the first and second N:1 serializer circuits to simultaneously serialize stored bits that were simultaneously sensed from the first and second columns respectively so that first stored bits from the first column are presented at the first I/O within different read words of a burst read sequence and second stored bits from the second column are presented at the second I/O within the different read words of the burst read sequence; and,
b) error correction encoding circuitry, the error correction encoding circuitry to generate only one parity bit for each of the different read words of the burst read sequence, and wherein, the memory chip further comprises a third column associated with a third sub-word line structure and a third N:1 serializer circuit, the third N:1 serializer circuit to serialize parity bits for the different read words after the parity bits were simultaneously sensed from the third column and presented to the third N:1 serializer circuit, such that, within any single read word of the different read words, each bit within the single read word is sourced from a different I/O of the memory chip and a different corresponding column of the memory chip, and wherein, a failure of the memory chip is most likely to exist along a same column of the memory chip such that, if the memory chip suffers the failure, only one bit in the single read word is in error.

2. The apparatus of claim 1 wherein the memory chip is a component of a stacked memory chip structure.

3. The apparatus of claim 1 wherein the memory chip is to store an entire cache line.

4. The apparatus of claim 1 wherein the memory chip is a dynamic random access memory.

5. The apparatus of claim 1 wherein the first N:1 serializer circuit is to receive additional stored bits from another activated column so that at least some of the additional stored bits are presented at the first I/O within another group of different read words of the burst read sequence.

6. The apparatus of claim 5 wherein a burst length of the burst read sequence is greater than a number of the stored bits that were sensed from the activated one of the columns.

7. The apparatus of claim 1 wherein each of the stored bits from the first column is presented at the first I/O within the different read words of the burst read sequence.

8. The apparatus of claim 1 wherein pairs of the stored bits from the first and second columns are presented at the first and second I/Os within each of the different read words of the burst read sequence.

9. A computing system, comprising:
a plurality of processing cores;
a main memory controller coupled to the processing cores; and,
a main memory that is coupled to the main memory controller, the main memory composed of memory chips, a memory chip of the memory chips comprising a) and b) below:
a) at least one macro-array comprising rows of word lines and a plurality of columns, the memory chip further comprising a first column associated with a first sub-word line structure and a second column associated with a second sub-word line structure, the memory chip further comprising a first N:1 serializer circuit between the first column and a first I/O of the memory chip and a second N:1 serializer circuit between the second column and a second I/O of the memory chip, wherein N is an integer, the first and second N:1 serializer circuits to simultaneously serialize stored bits that were simultaneously sensed from the first and second columns respectively so that first stored bits from the first column are presented at the first I/O within different read words of a burst read sequence and second stored bits from the second column are presented at the second I/O within the different read words of the burst read sequence; and,
b) error correction encoding circuitry, the error correction encoding circuitry to generate only one parity bit for each of the different read words of the burst read sequence, and wherein, the memory chip further comprises a third column associated with a third sub-word line structure and a third N:1 serializer circuit, the third N:1 serializer circuit to serialize parity bits for the different read word after the parity bits were simultaneously sensed from the third column and presented to the third N:1 serializer circuit, such that, within any single read word of the different read words, each bit within the single read word is sourced from a different I/O of the memory chip and a different corresponding column of the memory chip, and wherein, a failure of the memory chip is most likely to exist along a same column of the memory chip such that, if the memory chip suffers the failure, only one bit in the single read word is in error.

10. The computing system of claim 9 wherein the memory chips are stacked.

11. The computing system of claim 10 wherein a single one of the memory chips is to store a cache line provided by the main memory controller.

12. The computing system of claim 9 wherein the first and second columns are with different micro-arrays of the macro-array.

13. The computing system of claim 12 wherein the different micro-arrays are neighboring micro-arrays.

14. The computing system of claim 9 wherein the first N:1 serializer circuit is to receive additional stored bits from another activated column so that at least some of the additional stored bits are presented at the first I/O within another group of different read words of the burst read sequence.

15. The computing system of claim 14 wherein a burst length of the burst read sequence is greater than a number of the stored bits that were sensed from the another activated column.

16. The computing system of claim 9 wherein each of the stored bits from the first column is presented at the first I/O within the different read words of the burst read sequence.

17. The computing system of claim 16 wherein pairs of the stored bits from the first and second columns are presented at the first and second I/Os within each of the different read words of the burst read sequence.

* * * * *